United States Patent [19]
Mitsumoto

[11] Patent Number: 5,338,958
[45] Date of Patent: Aug. 16, 1994

[54] SEMICONDCUTOR DEVICE WITH HIGH SPEED FIELD EFFECT TRANSISTOR STRUCTURE REDUCING CONCENTRATIONS OF ELECTRIC FIELD NEAR DRAIN REGION

[75] Inventor: Hiroshi Mitsumoto, Tokyo, Japan

[73] Assignee: NEC Corporation, Tokyo, Japan

[21] Appl. No.: 10,284

[22] Filed: Jan. 28, 1993

[30] Foreign Application Priority Data

Jan. 29, 1992 [JP] Japan .................................. 4-038489

[51] Int. Cl.⁵ .............................................. H01L 29/78
[52] U.S. Cl. ...................... 257/330; 257/332; 257/344; 257/653
[58] Field of Search .............. 257/330, 332, 344, 653

[56] References Cited
U.S. PATENT DOCUMENTS
4,680,603  7/1987  Wei et al. ........................... 257/344

FOREIGN PATENT DOCUMENTS
2-110973  4/1990  Japan ................................. 257/330
2-153572  6/1990  Japan ................................. 257/330

Primary Examiner—Robert Limanek

[57] ABSTRACT

A semiconductor device includes a MISFET which has a gate polysilicon between source and drain regions, the gate polysilicon being covered with a gate insulator film. The gate polysilicon with the gate insulator film thereon has a protruded curved bottom portion extending in the substrate direction. The source and drain regions have their respective bottom surfaces located above the location where the bottom of the gate insulator film is most protruded toward the substrate. At least the drain region has in the vicinity of the protruded bottom portion of the gate polysilicon, a sidewall portion having a bottom portion projecting laterally towards the protruded portion of the gate polysilicon and an upper portion bent into a concave shape to form a pocket between that upper portion and the gate insulator film.

1 Claim, 3 Drawing Sheets

SEMICONDCUTOR DEVICE WITH HIGH SPEED FIELD EFFECT TRANSISTOR STRUCTURE REDUCING CONCENTRATIONS OF ELECTRIC FIELD NEAR DRAIN REGION

BACKGROUND OF THE INVENTION

1. Field of the Invention

This invention relates to a semiconductor device and a method of fabrication thereof, and more particularly to a MISFET or MOSFET structure and a fabrication method thereof, wherein it is capable of contribution to the maintenance of reliability for further speeding-up MISFETs or MOSFETs and to the realization of further ultrafine devices.

2. Description of the Prior Art

In a high integration silicon integrated circuit comprising a silicon MISFET or MOSFET as a chief constituent element, balanced size reduction of elements is intended with a scaling law into consideration for the purpose of constructing a fine circuit and speeding-up circuit operation. For this, a source-drain region is also contemplated to be formed into a shallow junction.

For example, as shown in FIG. 1 which is a schematic explanatory view illustrating the structure of a prior art U-MOS, in the vicinity of the drain thereof and a flow of carriers 10, a junction configuration of the drain of the prior art U-MOS in a cross-section in the direction connecting the source to the drain is substantially flush with its side surface making contact with the gate oxide film 2 and comprises only a flat bottom surface, or is slightly protruded toward the substrate 1, and hence includes a shallow side surface having a configuration of a bowl as in the conventional MOSFETs.

The configuration is caused owing to the physics of the ion implantation process into the drain region 7 and of the thermal treatment process. For this, the flow 10 of the inversion layer carriers reaches the drain without being spread too much after the pinch-off point, as illustrated in FIG. 1. Accordingly, spreading resistance is increased and the electric field is increased to promote the hot carrier degradation.

On the other hand, the channel, which is the passage for carriers, has its thickness defined by quantum mechanics and hence is not scaled. Physical phenomena in the vicinity of the drain are therefore not necessarily scaled, so that the electric field at the drain edge is more severely concentrated because the substrate density becomes higher and additionally, the junction between the source and the drain must be shallower as the device scaling proceeds.

This promotes the impact ionization phenomena and causes lowering of reliability owing to the hot carrier deterioration. In the MISFET or MOSFET, the electric field at the drain edge is increased as the MISFET or MOSFET is made fine as described above. To overcome this difficulty, some innovation related to a device structure is needed to lower such an increased electric field.

Although electric field moderation has been successfully obtained by reducing the concentration slope at the drain edge, as in LDD-MOSFETs and gate-drain overlapped LDD-MOSFETs, this suffers from another difficulty that it is unlikely to be made fine in view of an increase of the series resistance component and structural problems as the circuit becomes finer.

In the prior art MOSFETs, the electric field at the drain edge is increased as they are made finer, and hence realization of the electric field moderation is earnestly desired with the aid of a device structural innovation without relying on methods manipulating the impurity concentration slope at the drain edge.

SUMMARY OF THE INVENTION

The present invention has been made in view of the above described circumstances, and has for its object to provide a MISFET or MOSFET structure and a method of fabrication thereof, wherein the invention is capable of contribution to the maintenance of reliability for further speeding-up MISFETs or MOSFETs and to the realization of further ultra-fine devices.

In order to achieve the above object, according to the first aspect of the present invention, there is provided a semiconductor device, comprising a MISFET which includes between source and drain regions, a gate polysilicon covered with a gate insulator film, the MISFET being constructed such that the gate insulator film has a bottom portion formed into a protruded, curved shape extending in the substrate direction, that the source and drain regions have their respective bottom surfaces above the most protruded part of the gate insulator film toward the substrate, and that at least drain region has in the vicinity of the bottom portion of the gate polysilicon, a side wall which forms a channel and has an upper portion of the gate polysilicon, a side wall portion thereof being bent into a concave shape to form a pocket between it and the gate insulator film and a lower portion protruding towards the bottom portion of the gate polysilicon.

Further, in order to achieve the above object, according to a further object of the present invention, there is provided a method of fabrication of a semiconductor device, comprising the steps of:

(a) forming a pad oxide film on a Si substrate, depositing a thick nitride film on the pad oxide film, and patterning the thick nitride film with a negative pattern of the gate pattern;

(b) patterning the pad oxide film with the patterned thick nitride film taken as a mask, etching in succession the Si substrate to a predetermined depth to form a groove, and forming a gate oxide film on the exposed Si substrate and an oxidized nitride film on the upper surface and the side surface of the thick nitride film simultaneously, through a thermal oxidation method;

(c) filling the opening window part of the groove with polysilicon and further depositing the polysilicon until the upper surface of the deposited polysilicon is flush with or higher than the upper surface of the thick nitride film, and etching back the polysilicon so yielded up to the oxidized nitride film existent on the upper surface of the thick nitride film by etch-back planarization method and removing said thick nitride film;

(d) forming a source-drain region by first forming a first shallow source-drain region using a vertical low energy ion implantation method, and then, after formation of a gate sidewall film, forming a second deep source-drain region using a vertical high energy ion implantation method; and (e) forming an interconnect insulator film, contact holes therein, an electrode metal film, and a wiring pattern in succession.

As is clear from the foregoing description, according to the present invention, the source-drain region greatly reduces the concentration of the electric field in the vicinity of the drain because of its configuration and manifests a greater effect to reduce the problem of the hot carrier degradation. Further, in a preferred embodiment of the present invention, the source-drain is configured symmetrically, but the lowest potential barrier at a source edge is at the surface, so that the configuration of the sidewall of the source-drain region is effective only when that region is used as the drain.

However, even if the source edge is formed into the same configuration as that of the drain, it does not offer any bad influence on the characteristics of the device and utilizing such a fact that the device structure can be made symmetrical and accordingly the present device is useable also as a circuit device in which it is used dynamically exchanging the function of a source and a drain as a transfer gate. This ensures the succession to cell library assets of present integrated circuits.

Additionary, since the bottom of the source-drain region is located at a higher position than the lowest portion of the channel, and the edge of the source-drain region is configured so as to be separated away from the channel, a distance between both edges can be increased. For these two features, the present invention manifests an excellent effect to punch-through restriction.

The above and many other advantages, features and additional objects of the present invention will become manifest to those versed in the art upon making reference to the following detailed description and accompanying drawings in which preferred structural embodiments incorporating the principles of the present invention are shown by way of illustrative example.

DETAILED DESCRIPTION OF THE INVENTION

In the first place, the operating function and principle of the present invention will be described as follows. The essential of the construction of the present invention will be explained with reference to FIG. 2 which is a schematic explanatory view.

MOSFET of the present invention is one kind among those called a U-MOS. The structure of a U-MOS according to the present invention in the vicinity of a drain thereof and a flow of carriers 10 is as shown in FIG. 2.

Figure 1:
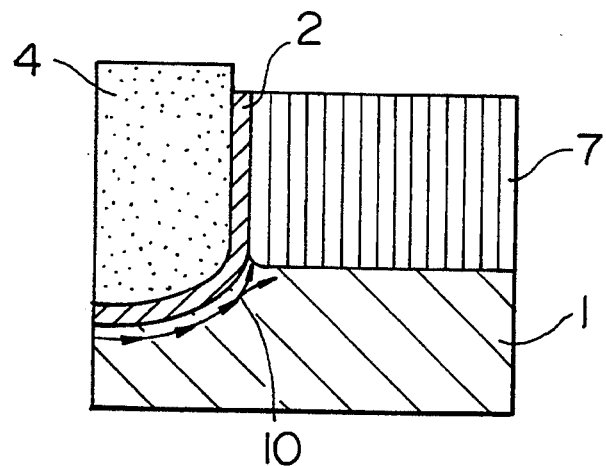
FIG. 1 is a schematic explanatory view illustrating the flow of inversion layer carriers in the vicinity of a drain of a prior art U-MOS.
Figure 2:
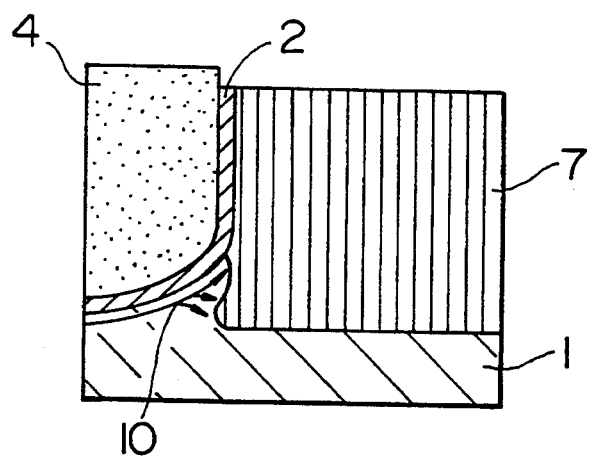
FIG. 2 is a schematic explanatory view illustrating the flow of inversion layer carriers in the vicinity of a drain of a U-MOS of the present invention.

A junction configuration of the U-MOS of the present invention in the cross-section in the direction connecting the source to the drain has such a shape as a wave destruction structure located below the draft of a ship, as illustrated in FIG. 2. More specifically, the deep portion of the drain sidewall is protruded toward the channel viewed from the location of the carriers at the pinch-off point in the channel, to form a pocket.

Accordingly, the electric field is dispersed in the pocket, so that the spreading resistance is moderated and electric field intensity is reduced.

Further, since the bottom of the source-drain region 7 is located at the location higher than the lowest position of the channel, the portion of the channel influences in itself the restriction of DIBL(Drain-Induced Barrier Lowering) and the restriction of the punch-through effect, owing to the restriction of the depletion layer elongation of the source-drain region and to the distance between the source and the drain being not shortened so much even if the sidewall of the source-drain region 7 is protruded, because of the U-MOS structure, which brings about a finer configuration of the circuit.

Such a structure can be realized by dividing the ion implantation for formation of the source-drain region 7 into two processes different in acceleration energy. Typically, as the acceleration energy is increased, implantation depth is increased and transversal spreading of the ions is also promoted. Thus, in the case of the U-MOS such ion implantation might be considered to be meaningless because of the increased junction depth.

However, provided that a sidewall spacer film is previously formed along the gate polysilicon 4 before the ion implantation of the higher acceleration energy, the tranversal spreading due to the higher acceleration energy can be cancelled out. Thus, the drain sidewall configuration required in the structure of the present invention is yielded after the thermal treatment by optimizing the thickness of the sidewall spacer film.

In the following, there will be described a typical embodiment of the structure of the present invention and of a method of fabrication thereof with reference to FIGS. 3A to 3E. Although for brevity only an n-MOSFET is employed, the present invention should naturally be extended to a p-MOSFET provided that the requirements of the present invention are satisfied. The present invention employs a p-type(100) Si substrate 1. Further, isolation process and well formation process are not essential to the present invention and hence are neglected in its description.

Figure 3A:
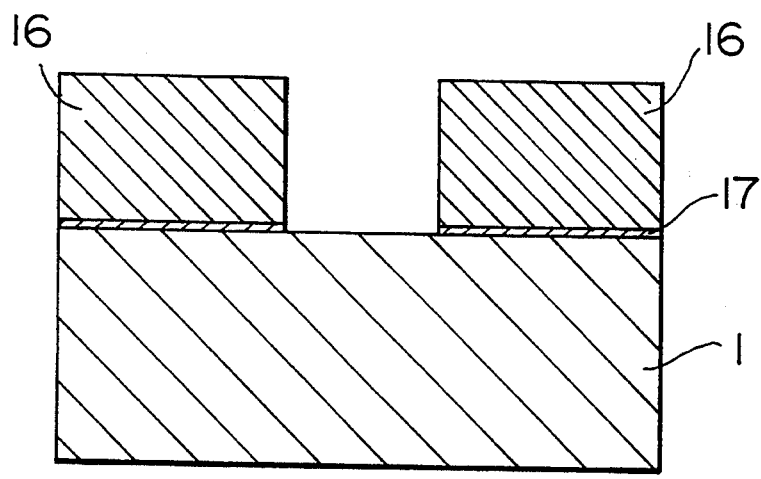
FIGS. 3A to 3E are cross-sectional views each illustrating the stage of a method of fabrication of a MOSFET of the present invention in the order of steps.

A structure illustrated in FIG. 3A is formed by forming a 20 nm pad oxide film 17 on a Si substrate using a 900° dry oxidation method, and then depositing over the entire surface of the substrate a 500 nm thick nitride film 16 by a thermal CVD method, and further removing, by a lithography and dry-etching method, part of the thick nitride film 16, the part being to be a gate using a negative pattern of a gate pattern.

Figure 3B:
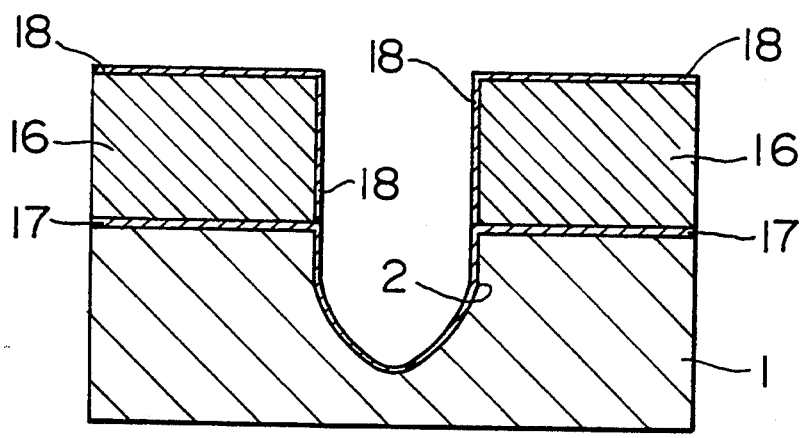
Figure 3C:
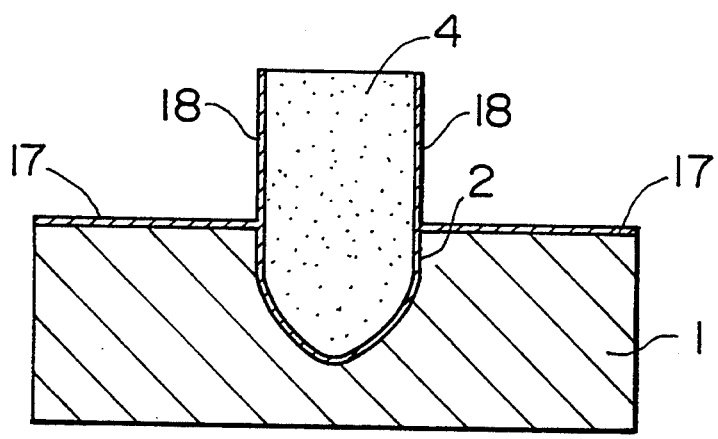

In succession by using the resulting structure as a mask, a U-shaped groove with 0.2 $\mu$m depth is formed at the Si substrate by etching the pad oxide film 17 and the Si substrate 1. Then, a structure illustrated in FIG. 3B is yielded by forming a 8 nm thick gate oxide film 2 on an exposed portion of the Si substrate 1 and simultaneously forming an oxidized nitride film 18 on an exposed portion of the thick nitride film 16.

Further, channel doping is carried out by implanting boron with the acceleration energy of 70 keV and 100 keV and with the dose of $1 \times 10^{13}$ cm$^{-3}$ using a rotating angled ion implantation method, and an opening window part is buried completely by depositing the gate polysilicon 4 by about 500 nm by a CVD method. Further, polystylene deposition and etching are carried out as an etch-back planarization method, the etching being carried out until the oxidized nitride film 18 located above the thick nitride film 16 is etched off. In succession, the exposed thick nitride film 16 is removed over the entire surface thereof with hot phosphoric acid to yield a structure illustrated in FIG. 3C.

Figure 3D:
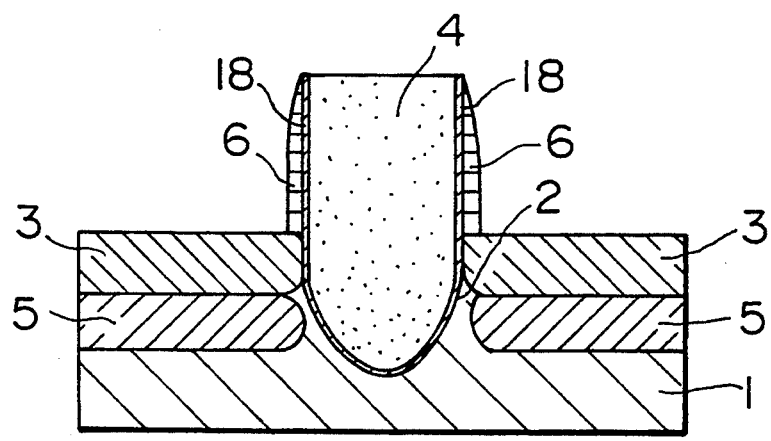

Thereupon, although there is left behind a part of the oxidized nitride film 18 unnecessary in itself on the sidewall of the gate polysilicon 4, this presents no bad influence on the construction of the present device. In succession, a structure illustrated in FIG. 3D is yielded by vertically implanting arsenic under 20 keV acceleration energy and with the $1\times10^{15}$ cm$^{-2}$ dose with the gate polysilicon 4 as a mask to form a shallow source-drain region 3, and then forming a 100 nm thick sidewall spacer film 6 building up along the sidewall of the gate polysilicon 4 using an etching-back method, and further vertically implanting arsenic under 50 keV acceleration energy and with the $1\times10^{15}$ cm$^{-2}$ dose to form a deep source-drain region 5.

Figure 3E:
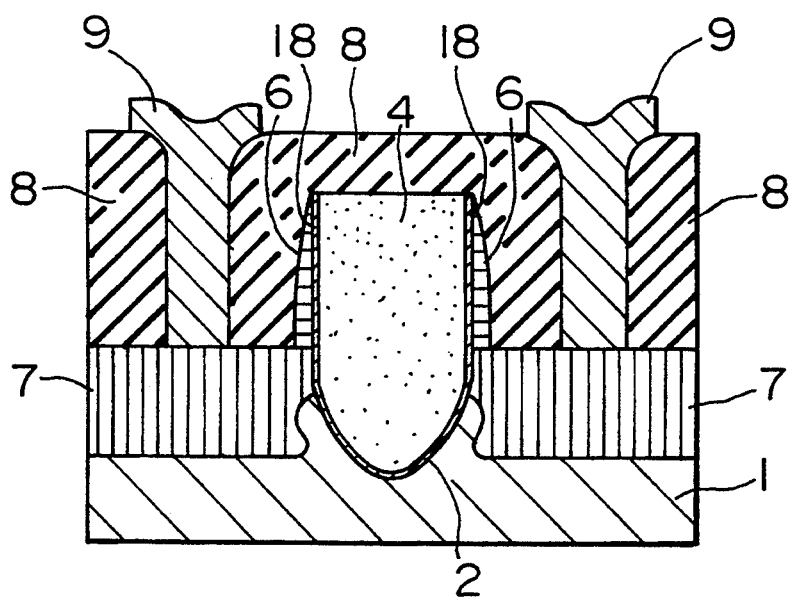

Finally, a device structure illustrated in FIG. 3E is yielded by forming a 300 nm thick interconnected insulator film 8 by a CVD method and smoothing the configuration of the side surface of the source-drain region 7 comprising the shallow source-drain region 3 and the deep source-drain region 5 by annealing at 850° C., 20 minutes N$_2$, and further carrying out a contact formation process and formation of an electrode metal film 9 through Al deposition and patterning.

In the resulting device structure, the bottom of the gate oxide film 2 forms a curved portion protruded in the substrate direction, and the bottom of the source-drain region 7 is located at a higher level with respect to the location where the bottom of the gate oxide film 2 is most protruded toward the substrate, and further the sidewall of the source-drain region 7 is protruded toward the channel and at its lower portion is close to the bottom of gate oxide film 2 and is bent into a concave shape at its upper portion to form a pocket between it and the gate oxide film 2. The pocket serves to receive the flow 10 of the inverted layer carriers and disperse them to the drain.

What is claimed is:

1. A semiconductor device comprising a MISFET which includes a gate polysilicon between a source region and a drain region, said gate polysilicon being covered with a gate insulator film, said gate polysilicon covered with said gate insulator film including a protruded, curved bottom portion extending in a direction of said substrate and into said substrate;

said bottom portion having a curved surface and said gate insulator film having a most protruded part into said substrate;

said source region and drain region each including a bottom surface located above said most protruded part of said gate insulator film; and at least said drain region including in the vicinity of a bottom thereof and around said protruded curved bottom portion of said gate polysilicon covered with said gate insulator film, a shaped sidewall portion including a lower portion protruding towards said bottom portion of said gate polysilicon and an upper portion of a concave shape to form a pocket between said upper portion and said gate insulator film.

* * * * *